United States Patent
Hopper et al.

(10) Patent No.: US 7,642,116 B1
(45) Date of Patent: Jan. 5, 2010

(54) METHOD OF FORMING A PHOTODIODE THAT REDUCES THE EFFECTS OF SURFACE RECOMBINATION SITES

(75) Inventors: Peter J. Hopper, San Jose, CA (US); Michael Mian, Livermore, CA (US); Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 488 days.

(21) Appl. No.: 11/476,525

(22) Filed: Jun. 28, 2006

Related U.S. Application Data

(62) Division of application No. 10/718,456, filed on Nov. 19, 2003, now Pat. No. 7,105,906.

(51) Int. Cl.
 *H01L 31/113* (2006.01)
(52) U.S. Cl. .................. 438/57; 257/607; 257/292; 257/431
(58) Field of Classification Search .......... 257/232, 257/233, 292, 431–436, 440, 463, 607, E31.057, 257/E31.068; 438/57
See application file for complete search history.

(56) References Cited

U.S. PATENT DOCUMENTS

| | | | | |
|---|---|---|---|---|
| 3,745,424 | A | 7/1973 | Ohuchi et al. | 317/235 R |
| 4,682,203 | A | 7/1987 | Konda | 357/51 |
| 5,162,887 | A * | 11/1992 | Dierschke | 257/465 |
| 5,965,875 | A | 10/1999 | Merrill | 250/226 |
| 6,023,081 | A | 2/2000 | Drowley et al. | 257/292 |
| 6,063,682 | A | 5/2000 | Sultan et al. | 438/305 |
| 6,100,551 | A | 8/2000 | Lee et al. | 257/232 |
| 6,218,210 | B1 | 4/2001 | Park | 438/57 |
| 6,368,928 | B1 | 4/2002 | Wang et al. | 438/307 |
| 6,392,282 | B1 | 5/2002 | Sahara et al. | 257/438 |
| 6,459,140 | B1 | 10/2002 | Johansson et al. | 257/592 |
| 6,483,129 | B2 | 11/2002 | Rhodes et al. | 257/185 |
| 6,504,196 | B1 | 1/2003 | Rhodes | 257/292 |
| 6,504,219 | B1 | 1/2003 | Puchner et al. | 257/371 |
| 6,552,320 | B1 | 4/2003 | Pan | 250/208.1 |
| 6,593,607 | B1 * | 7/2003 | Hseih | 257/292 |
| 6,632,702 | B2 | 10/2003 | Eom et al. | 438/73 |
| 6,921,934 | B2 * | 7/2005 | Patrick | 257/292 |
| 6,958,194 | B1 | 10/2005 | Hopper et al. | 428/641 |

OTHER PUBLICATIONS

B. Dierickx-FillFactory Image Sensors, CMOS Image Sensors-Concepts, [retrieved on Oct. 31, 2003]. Retrieved from the Internet: <URL:http://www.framos.de/pdf_sheets/h1concepts.pdf>, pp. C21 thru C36., See p. C21.

* cited by examiner

*Primary Examiner*—Matthew C Landau
*Assistant Examiner*—Candice Y Chan
(74) *Attorney, Agent, or Firm*—Mark C. Pickering

(57) ABSTRACT

The loss of photogenerated electrons to surface electron-hole recombination sites is minimized by utilizing a first p-type surface region to form a depletion region that functions as a first barrier that repels photogenerated electrons from the surface recombination sites, and a second p-type surface region that provides a substantial change in the dopant concentration.

20 Claims, 3 Drawing Sheets

METHOD OF FORMING A PHOTODIODE THAT REDUCES THE EFFECTS OF SURFACE RECOMBINATION SITES

This is a divisional application of application Ser. No. 10/718,456 filed on Nov. 19, 2003 for Photodiode that Reduces the Effects of Surface Recombination Sites by Peter Hopper, et al., now U.S. Pat. No. 7,105,906, issued on Sep. 12, 2006.

BACKGROUND OF THE INVENTION

1. Field of the Invention

The present invention relates to photodiodes and, more particularly, to a photodiode that reduces the effects of the surface electron-hole recombination sites.

2. Description of the Related Art

A p-type material is a semiconductor material, such as single-crystal silicon, that includes impurity "acceptor" atoms (atoms that are missing one electron in their outer shell). All of the column IIIA elements (group 13) (Boron, Aluminum, Gallium, Indium, and Thalium) have one missing electron in the outer shell and are acceptor atoms.

FIG. 1 shows a graph that illustrates the dopant profiles of the column IIIA elements in silicon when implanted at the same dose at the same energy for the same amount of time. As shown in FIG. 1, as the size of the atom increases, the depth of the implant decreases. As a result, the element boron, which is the smallest atom, has the deepest implant.

FIG. 2 shows a graph that illustrates the dopant profiles of each of the implanted column IIIA elements when thermally cycled in a neutral ambient for the same amount of time. As shown in FIG. 2, after thermal cycling, the smallest atom, boron, diffuses the most, while the largest atom, thalium, diffuses the least, essentially none at all.

As further shown in FIG. 2, the element indium also diffuses very little due to the large size of the atom. Indium is not commonly used in semiconductor fabrication because indium has a maximum dopant concentration of approximately $5 \times 10^{17}$ to $1 \times 10^{18}$ atoms/cm$^3$, which is an LDD dopant concentration. This is due to the solid solubility and the tendency of indium to precipitate out.

A photodiode is a semiconductor device that is commonly formed by combining a p-type material with an n-type material. When exposed to electromagnetic radiation, such as visible light, a photodiode generates a number of electron-hole pairs at different depths within the device depending upon the depth at which the electromagnetic radiation was absorbed by the device.

Black and white photodiodes are photodiodes that can collect photons over all or substantially all of the visible spectrum, which includes many colors, and therefore generate electron-hole pairs over a large vertical range within the photodiode. On the other hand, color photodiodes, such as blue, green, and red photodiodes, are photodiodes that collect photons over a much narrower range of wavelengths, and therefore generate electron-hole pairs over a much smaller vertical range within the photodiode.

Black and white photodiodes can be used as color photodiodes by placing a color filter, such as a blue, green, or red filter, over the black and white photodiode. Thus, although a black and white photodiode is capable of capturing a wider range of the visible light spectrum, the color filter limits the photodiode to collecting only a single color.

FIG. 3 shows a cross-sectional diagram that illustrates a prior-art blue photodiode 300. As shown in FIG. 3, blue photodiode 300 includes a first p-type (boron) region 310, such as a substrate, a second n-type region 312, such as an epitaxial layer or well, that overlies and contacts p-type region 310, and a depletion region 314 that is formed across the pn junction between p-type region 310 and n-type region 312.

Photodiode 300 can be formed with a blue filter and a large depletion region 314 that collects blue light, or can be formed without a blue filter and with a small depletion region 314 that collects substantially only blue light. Further, photodiode 300 includes an isolation region 316, such as oxide, that is formed on n-type region 312.

In operation, blue photodiode 300 is first reset by placing a reset voltage on n-type region 312 that reverse biases the pn junction. The reverse-biased voltage, which sets up an electric field across the junction, increases the width of depletion region 314 so that the blue portion of the electromagnetic spectrum can be absorbed in depletion region 314.

Once photodiode 300 is reset, photodiode 300 is then exposed to a source of electromagnetic radiation for an integration period. When photodiode 300 is struck by electromagnetic radiation during the integration period, the radiation penetrates into the semiconductor material down to an absorption depth that depends on the wavelength of the radiation.

For example, blue light has an absorption depth of approximately 0.7 microns, while red light has an absorption depth of approximately 1.2 microns (measured down from the top surface of n-type region 312 when n-type region 312 is formed as an epitaxial region, or measured down from the top surface of p-type region 310 when n-type region 312 is an implanted region in region 310).

Blue wavelengths of light are absorbed in depletion region 314 which, in response, generates a number of electron-hole pairs in depletion region 314. The electric field set up across the reverse-biased pn junction attracts the electrons that are formed in depletion region 314 (along with the electrons that are formed in p-type region 310 within a diffusion length of depletion region 314) to n-type region 312 where each additional electron reduces the magnitude of the reset voltage that was placed on n-type region 312.

Thus, at the end of the integration period, the total number of electrons collected by n-type region 312 has reduced the reset voltage to an integrated voltage. As a result, the total number of electrons collected by n-type region 312 during the integration period, which is a measure of the intensity of the blue electromagnetic radiation, can be determined by subtracting the integrated voltage from the reset voltage.

One problem with photodiode 300 is that photodiode 300 has a large number of electron-hole recombination sites that are located at the boundary between n-type region 312 and isolation layer 316. The surface electron-hole recombination sites, in turn, consume a number of the photo-generated electrons.

The lost electrons reduce the total number of collected electrons which erroneously increases the magnitude of the integrated voltage. As a result, the surface electron-hole recombination sites of photodiode 300 reduce the intensity of the blue signal that is calculated by subtracting the integrated voltage from the reset voltage.

Thus, there is a need for a photodiode that reduces the effects of the surface electron-hole recombination sites.

DETAILED DESCRIPTION OF THE INVENTION

Figure 1:
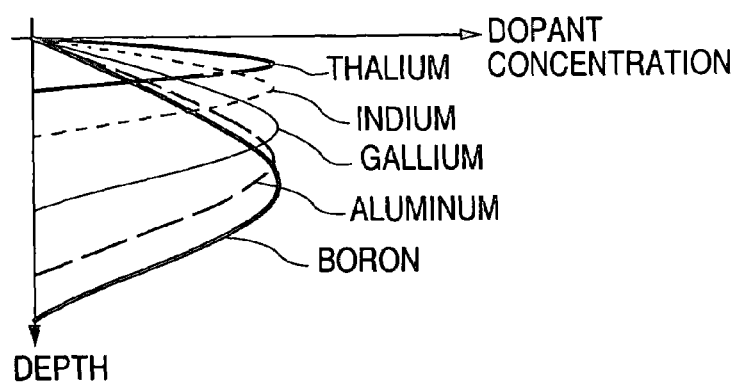
FIG. 1 is a graph illustrating the dopant profiles of the column IIIA elements in silicon when implanted at the same dose at the same energy for the same amount of time.
Figure 2:
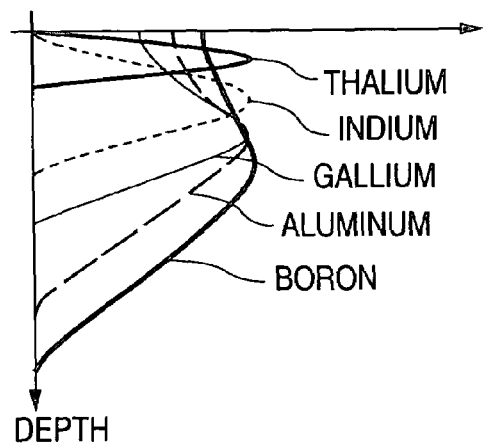
FIG. 2 is a graph illustrating the dopant profiles of each of the implanted column IIIA elements when thermally treated for the same amount of time.
Figure 3:
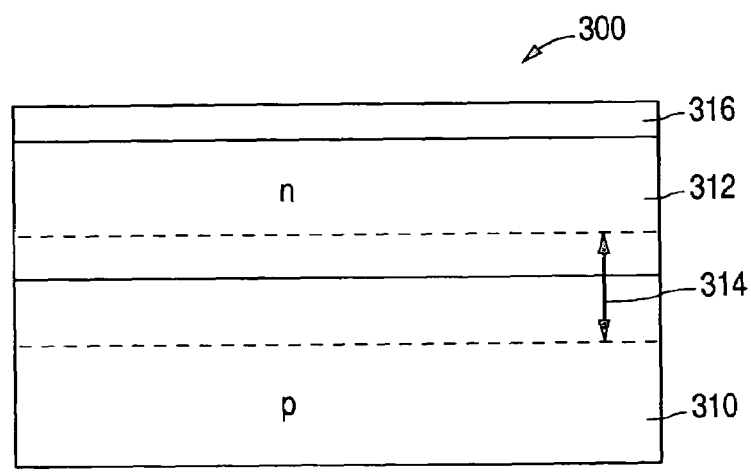
FIG. 3 is a cross-sectional diagram illustrating a prior-art blue photodiode 300.
Figure 4:
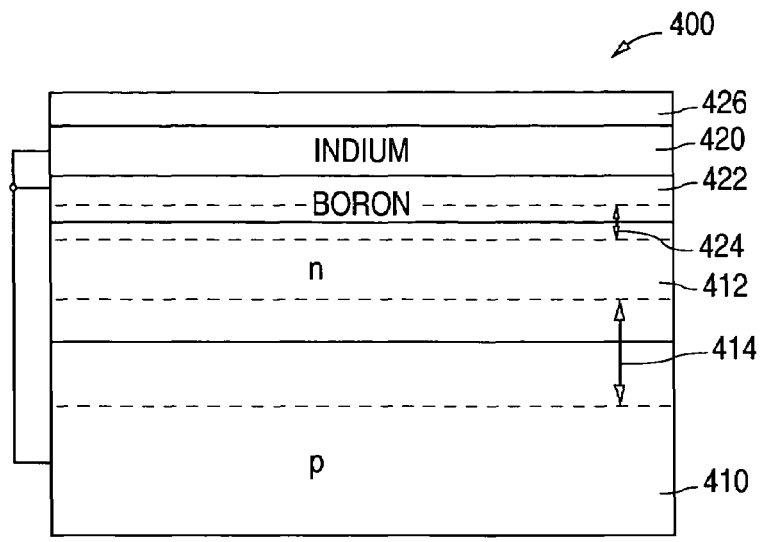
FIG. 4 is a cross-sectional diagram illustrating an example of a blue photodiode 400 in accordance with the present invention.

FIG. 4 shows a cross-sectional diagram that illustrates an example of a blue photodiode 400 in accordance with the present invention. As described in greater detail below, blue photodiode 400 utilizes a p-type surface region to form a barrier that repels photogenerated electrons from the surface electron-hole recombination sites.

As shown in FIG. 4, blue photodiode 400 includes a first p-type (boron) region 410, such as a substrate, a second n-type region 412, such as an epitaxial layer or well, that overlies and contacts p-type region 410, and a depletion region 414 that is formed across the pn junction between p-type region 410 and n-type region 412.

In the present example, n-type region 412 has a moderate dopant concentration, such as $5 \times 10^{17}$ to $1 \times 10^{18}$ atoms/cm$^3$, that is approximately equal to the dopant concentration of a lightly-doped-drain (LDD) region. Alternately, n-type region 412 can be formed to have a heavier (n+), e.g., $1 \times 10^{19}$ to $1 \times 10^{20}$ atoms/cm$^3$, (or lighter) dopant concentration. In addition, p-type region 410 has a light dopant concentration, such as $1 \times 10^{12}$ atoms/cm$^3$.

Further, in accordance with the present invention, photodiode 400 includes a region 420 that is formed over n-type region 412. Region 420 includes a moderately-doped concentration of indium (which is p-type in silicon), such as $5 \times 10^{17}$ to $1 \times 10^{18}$ atoms/cm$^3$. In addition, region 420 has relatively shallow depth (after thermal cycling), e.g., 0.1 to 0.3 microns (measured down from the top surface of n-type region 412 when n-type region 412 is formed as an epitaxial region, or measured down from the top surface of p-type region 410 when n-type region 412 is an implanted region in region 410). This depth is well above the absorption depth of blue light.

In addition, photodiode 400 can also include a region 422 that contacts n-type region 412 and region 420. Region 422 in the present example includes a moderately-doped concentration of boron (which is p-type in silicon), such as $5 \times 10^{17}$ to $1 \times 10^{18}$ atoms/cm$^3$. Further, region 422 has a relatively shallow depth (after thermal cycling), e.g., 0.2 to 0.4 microns (measured down from the top surface of n-type region 412 when n-type region 412 is formed as an epitaxial region, or measured down from the top surface of p-type region 410 when n-type region 412 is an implanted region in region 410). This depth is also well above the absorption depth of blue light. Alternately, region 422 can be formed to have a heavier (p+), e.g., $1 \times 10^{19}$ to $1 \times 10^{20}$ atoms/cm$^3$, (or lighter) dopant concentration.

In the present example, during fabrication, indium and boron are implanted for the same period of time with the same implant energy to have substantially the same dopant concentration, such as $5 \times 10^{17}$ to $1 \times 10^{18}$ atoms/cm$^3$. As noted above, the boron implant is deeper than the indium implant due to the larger size of the indium atom.

Figure 5:
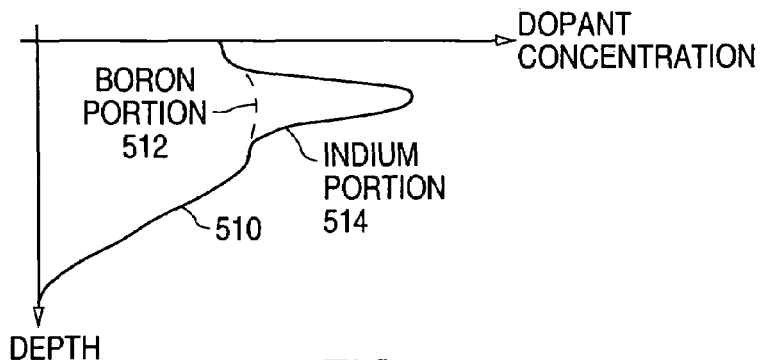
FIG. 5 is a graph illustrating the dopant profiles of the indium and boron implants in accordance with the present invention.

FIG. 5 shows a graph that illustrates the dopant profiles of the indium and boron implants in accordance with the present invention. As shown in FIG. 5, by implanting boron and indium with the same dopant concentration and implant energy, the combined p-type regions, as shown by line 510, have a first boron portion 512 that has a first dopant concentration, and a second portion 514 with indium that has a second dopant concentration that is substantially greater than the first dopant concentration.

In addition, as further shown by line 510 in FIG. 5, the rate of change of the dopant concentration to depth is substantially greater with second portion 514 than the rate of change of the dopant concentration to depth of first portion 512. Thus, the indium implant forms a steep dopant concentration gradient.

Returning to FIG. 4, blue photodiode 400 also includes a depletion region 424 that is formed across the pn junction of p-type region 422 and n-type region 412, and an isolation region 426, such as oxide, that is formed on region 420. Regions 420 and 422 also electrically contact p-type region 414, directly or indirectly and, therefore, have the same potential as p-type region 410.

Photodiode 400 operates the same as photodiode 300 except that the electric field across depletion region 424 repels photogenerated blue electrons in n-type region 412 from depletion region 424. As a result, depletion region 424 functions as a first barrier to blue photogenerated electrons in n-type region 412 from reaching the surface recombination sites.

In addition, the sudden increase in dopant concentration when moving from region 422 to region 420 functions as a second barrier to blue photogenerated electrons in n-type region 412 from reaching the surface recombination sites. Thus, the present invention provides two barriers to photogenerated electrons in n-type region 412 from reaching the surface and being lost to recombination.

In addition to providing two barriers to photogenerated electrons, the present invention also provides non-blue electrons to replace a number of the blue electrons that are able to surmount both barriers, and then lost to surface recombination. The non-blue electrons are provided via depletion region 424 which collects substantially no electromagnetic radiation that represents blue light.

Non-blue wavelengths of light, such as ultra-violet (UV), are absorbed in depletion region 424 which, in response, generates a number of electron-hole pairs in depletion region 424. The electric field set up across the reverse-biased pn junction (regions 420 and 422 are electrically connected to p-type region 410) attracts the non-blue electrons that are formed in depletion region 424 (along with the non-blue electrons that are formed in p-type region 422 within a diffusion length of depletion region 424) to n-type region 412 where each additional electron reduces the magnitude of the reset voltage that was placed on n-type region 412.

Thus, in the present invention, at the end of the integration period, the total number of electrons collected by n-type region 412 has been increased by forming two barriers that reduce the number of photogenerated electrons that are lost to surface recombination, and adding non-blue electrons to replace a number of blue electrons that continue to be lost to surface recombination.

In the present example, the dopant concentrations of n-type region 412 and p-type (boron) region 422 are approximately the same (whether moderately or heavily doped). As a result, the width of depletion region 424 has its smallest size and, therefore, collects the smallest number of non-blue, e.g., UV, photons to replace the lost blue electrons.

The number of non-blue, e.g., UV, photons that are collected to replace the lost blue electrons can be increased by varying the dopant concentrations of the regions. For example, by increasing the dopant concentration of n-type region 412 and/or reducing the dopant concentration of region 422, a larger number of non-blue photons can be collected.

In a first alternate embodiment, only one of the regions 420 and 422 is formed. In this embodiment, the photodiode has only one of the barriers. In addition, indium and boron, due to the difference in depth, respond to different portions of the non-blue, e.g., UV, portion of the spectrum.

Figure 6:
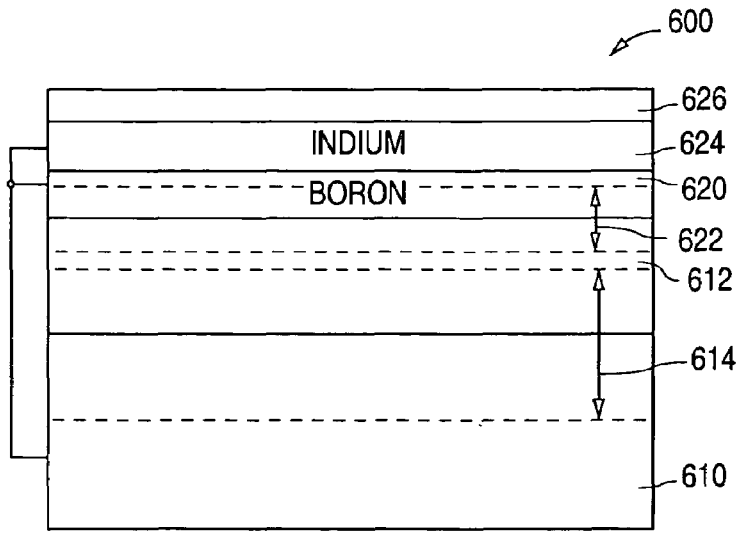
FIG. 6 is a cross-sectional diagram illustrating an example of a black and white photodiode 600 in accordance with the present invention.

FIG. 6 shows a cross-sectional diagram that illustrates an example of a black and white photodiode 600 in accordance with the present invention. As shown in FIG. 6, black and white photodiode 600 includes a first p-type (boron) region 610, such as a substrate, a second n-type region 612, such as an epitaxial layer or well, that overlies and contacts p-type region 610, and a depletion region 614 that is formed across the pn junction between p-type region 610 and n-type region 612. In addition, photodiode 600 includes a p-type (boron) region 620 that contacts n-type region 612, and a depletion region 622 that is formed across the pn junction of p-type region 620 and n-type region 612.

In the present example, p-type (boron) region 610, n-type region 612, and p-type (boron) region 620 are formed so that, when the pn junctions associated with depletion regions 614 and 622 are reverse biased prior to beginning an integration period, the depletion regions 614 and 622 respond to all or, as shown in FIG. 6, substantially all of the visible light spectrum (the depletion regions 614 and 622 do not overlap in FIG. 6).

As further shown in FIG. 6, photodiode 600 further includes a region 624 that is formed on p-type (boron) region 620, and an isolation region 626, such as oxide, that is formed on region 620. Region 624 includes a moderately-doped concentration of indium, such as $5 \times 10^{17}$ to $1 \times 10^{18}$ atoms/cm$^3$, which has a relatively shallow depth, e.g., 0.1 to 0.3 microns (measured down from the top surface of n-type region 612 when n-type region 612 is formed as an epitaxial region, or measured down from the top surface of p-type region 610 when n-type region 612 is an implanted region in region 610). Regions 620 and 624 also electrically contact p-type region 610, directly or indirectly and, therefore, have the same potential as p-type region 610.

Black and white photodiode 600 operates the same as photodiode 400 except that the electric field across depletion region 622 collects blue light rather than non-blue light. Further, depletion region 622 repels photogenerated electrons in n-type region 612 from depletion region 622. As a result, depletion region 622 functions as a first barrier to photogenerated electrons in n-type region 612 from reaching the surface recombination sites.

In addition, the sudden increase in dopant concentration when moving from region 620 to region 624 functions as a second barrier to photogenerated electrons in n-type region 612 from reaching the surface recombination sites. Thus, the present invention provides two barriers to photogenerated electrons in n-type region 612 from reaching the surface and being lost to recombination.

Photodiode 600 can also be used as a color photodiode by placing a color filter, such as a blue, green, or red filter, over photodiode 600. Thus, although photodiode 600 is capable of capturing a wider range of the visible light spectrum, the color filter limits photodiode 600 to collecting only a single color.

Figure 7A:
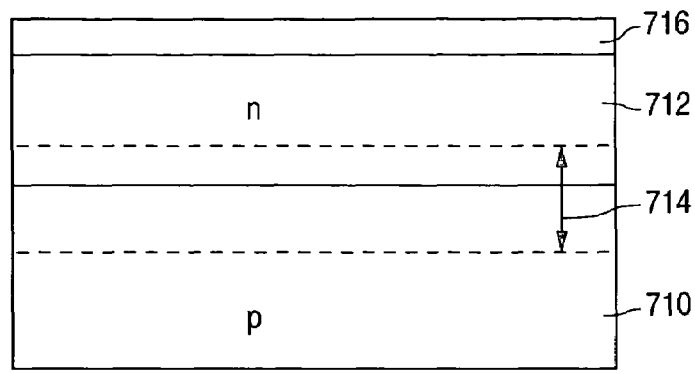
FIGS. 7A-7C are a series of cross-sectional views illustrating an example of a method of forming a photodiode in accordance with the present invention.
Figure 7B:
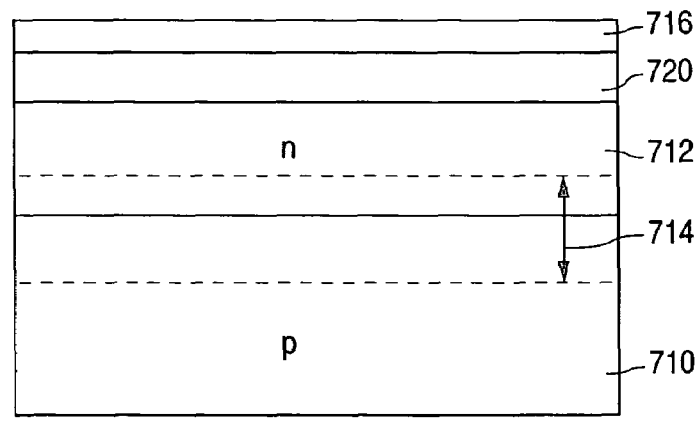
Figure 7C:
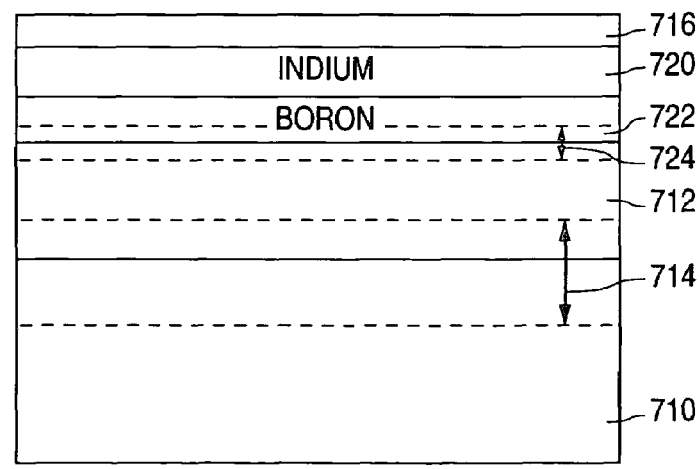

FIGS. 7A-7C show a series of cross-sectional views that illustrate an example of a method of forming a photodiode in accordance with the present invention. As shown in FIG. 7A, the method, which utilizes a conventionally-formed p-type (boron) region 710, begins by forming an n-type region 712 that contacts p-type region 710. N-type region 712 can be formed, for example, by epitaxially growing an n-type semiconductor material that has a moderate to heavy dopant concentration on region 710, or by implanting region 710 with an n-type dopant.

In addition, as a result of forming n-type region 712 to contact p-type region 710, the junction between p-type region 710 and n-type region 712 forms a depletion region 714. Next, following the formation of n-type region 712, a layer of sacrificial oxide 716 is formed on n-type region 712.

As shown in FIG. 7B, after sacrificial oxide layer 716 has been formed, the surface of n-type region 712 is implanted with indium to form p-type region 720. The indium is implanted at a relatively-low implant energy such that the implant peak is approximately, for example, 0.1-0.3 microns below the top surface (a wider range can alternately be used and falls within the scope of the present invention). In addition, the indium is implanted to have a moderate dopant concentration of approximately $5 \times 10^{17}$ to $1 \times 10^{18}$ atoms/cm$^3$.

As shown in FIG. 7C, following the formation of region 720, boron can be implanted to form a p-type region 722. As a result of forming p-type region 722 to contact n-type region 712, the junction between p-type region 722 and n-type region 712 forms a depletion region 724. Following this, sacrificial oxide layer 716 is removed and the method continues with conventional steps.

The boron can be implanted to form a depletion region barrier and collect non-blue photons in the case of a blue photodiode, or to form a depletion region barrier and collect blue photons in the case of a black and white photodiode. The boron can be implanted to have a moderate-to-heavy dopant concentration. For example, the boron can have substantially the same dopant concentration as n-type region 712.

It should be understood that the above descriptions are examples of the present invention, and that various alternatives of the invention described herein may be employed in practicing the invention. For example, when boron is implanted, the order of implanting indium and boron can be reversed. Thus, it is intended that the following claims define the scope of the invention and that structures and methods within the scope of these claims and their equivalents be covered thereby.

What is claimed is:

1. A method of forming a photodiode, the photodiode having a first region of semiconductor material, the first region having a first conductivity type and a first dopant concentration, the method comprising:

forming a second region, the second region having a second conductivity type and a second dopant concentration, and touching a top surface of the first region at a first junction, a first depletion region extending across the first junction;

forming a third region with a first dopant, the third region having the first conductivity type and a third dopant concentration, and touching a top surface of the second region at a second junction, a second depletion region extending across the second junction; and forming a fourth region with a second dopant, the fourth region having the first conductivity type and a fourth dopant concentration, and touching the third region, the first and second dopants being different.

2. The method of claim 1 wherein substantially all of a bottom surface of the fourth region touches a top surface of the third region.

3. The method of claim 2 wherein:
the first depletion region absorbs electromagnetic radiation that represents blue light, and generates blue electron-hole pairs in response to absorbing the electromagnetic radiation that represents blue light; and
the second depletion region absorbs substantially no electromagnetic radiation that represents blue light.

4. The method of claim 2 wherein the fourth dopant concentration is substantially greater than the third dopant concentration.

5. The method of claim 2 wherein:
the second depletion region absorbs electromagnetic radiation that represents blue light, and generates blue electron-hole pairs in response to absorbing the electromagnetic radiation that represents blue light, and
the first depletion region absorbs electromagnetic radiation that includes green light.

6. The method of claim 2 wherein the first region has a p conductivity type, the second region has an n conductivity type, the third region includes a first Group IIIA element and is free of a second Group IIIA element, and the fourth region includes both the first Group IIIA element and the second Group IIIA element, the first Group IIIA element and the second Group IIIA element being different.

7. The method of claim 2 wherein:
the first region is a wafer; and
the third region and the fourth region are regions implanted into an epitaxial layer formed on the wafer.

8. The method of claim 2 wherein:
the first region is a wafer; and
the third region and the fourth region are regions implanted into the wafer.

9. The method of claim 1 wherein:
the second region includes all contiguous regions of the second conductivity type;
the first depletion region extends across a junction between the second region and all contiguous regions of the first conductivity type that touch the second region; and
the second depletion region is spaced apart from the first depletion region.

10. The method of claim 9 wherein:
the first depletion region absorbs electromagnetic radiation that represents blue light, and generates blue electron-hole pairs in response to absorbing the electromagnetic radiation that represents blue light; and
the second depletion region absorbs substantially no electromagnetic radiation that represents blue light.

11. The method of claim 9 wherein the fourth dopant concentration is substantially greater than the third dopant concentration.

12. The method of claim 9 wherein:
the second depletion region absorbs electromagnetic radiation that represents blue light, and generates blue electron-hole pairs in response to absorbing the electromagnetic radiation that represents blue light, and
the first depletion region absorbs electromagnetic radiation that includes green light.

13. The method of claim 9 wherein the first region has a p conductivity type, the second region has an n conductivity type, the third region includes a first Group IIIA element and is free of a second Group IIIA element, and the fourth region includes both the first Group IIIA element and the second Group IIIA element, the first Group IIIA element and the second Group IIIA element being different.

14. The method of claim 1 wherein no region of the second conductivity type lies vertically between any portion of the third region and any portion of the fourth region.

15. The method of claim 14 wherein:
the first depletion region absorbs electromagnetic radiation that represents blue light, and generates blue electron-hole pairs in response to absorbing the electromagnetic radiation that represents blue light; and
the second depletion region absorbs substantially no electromagnetic radiation that represents blue light.

16. The method of claim 14 wherein the fourth dopant concentration is substantially greater than the third dopant concentration.

17. The method of claim 14 wherein:
the second depletion region absorbs electromagnetic radiation that represents blue light, and generates blue electron-hole pairs in response to absorbing the electromagnetic radiation that represents blue light, and
the first depletion region absorbs electromagnetic radiation that includes green light.

18. The method of claim 14 wherein the first region has a p conductivity type, the second region has an n conductivity type, the third region includes a first Group IIIA element and is free of a second Group IIIA element, and the fourth region includes both the first Group IIIA element and the second Group IIIA element, the first Group IIIA element and the second Group IIIA element being different.

19. The method of claim 14 wherein:
the first region is a wafer; and
the third region and the fourth region are regions implanted into an epitaxial layer formed on the wafer.

20. The method of claim 14 wherein:
the first region is a wafer; and
the third region and the fourth region are regions implanted into the wafer.

* * * * *